United States Patent
Cho

(10) Patent No.: US 9,423,543 B2
(45) Date of Patent: Aug. 23, 2016

(54) DISPLAY DEVICE AND METHOD FOR MANUFACTURING THE SAME

(71) Applicant: LG Display Co., Ltd., Seoul (KR)

(72) Inventor: Wonjong Cho, Seoul (KR)

(73) Assignee: LG Display Co., Ltd., Seoul (KR)

( * ) Notice: Subject to any disclaimer, the term of this patent is extended or adjusted under 35 U.S.C. 154(b) by 296 days.

(21) Appl. No.: 14/086,184

(22) Filed: Nov. 21, 2013

(65) Prior Publication Data

US 2014/0176880 A1    Jun. 26, 2014

(30) Foreign Application Priority Data

Dec. 21, 2012  (KR) .......... 10-2012-0151147

(51) Int. Cl.
*G02F 1/1335* (2006.01)
*G02B 5/30* (2006.01)
*G02F 1/13363* (2006.01)
*H01L 51/52* (2006.01)

(52) U.S. Cl.
CPC .......... *G02B 5/3083* (2013.01); *G02F 1/13363* (2013.01); *H01L 51/5293* (2013.01); *G02F 2001/133633* (2013.01); *G02F 2001/133638* (2013.01)

(58) Field of Classification Search
CPC ................................. G02F 1/133528
USPC ........................................... 349/96
See application file for complete search history.

(56) References Cited

U.S. PATENT DOCUMENTS

2004/0257497 A1* 12/2004 Paukshto .......... G02F 1/133528
                                                         349/98
2006/0262255 A1  11/2006  Wang et al.
2012/0162399 A1  6/2012   Park et al.
2012/0212692 A1  8/2012   Ryu et al.

FOREIGN PATENT DOCUMENTS

| CN | 1956852 A | 5/2007 |
| CN | 101661129 A | 3/2010 |
| WO | WO 2012/086977 A2 | 6/2012 |
| WO | WO 2013/028321 A1 | 2/2013 |

OTHER PUBLICATIONS

United Kingdom Intellectual Property Office, Office Action, Application No. GB 1321329.3, Jul. 13, 2015, 3 pages.
United Kingdom Intellectual Property Office, Office Action, Application No. GB 1321329.3, May 19, 2014, five pages.
Chinese First Office Action, Chinese Application No. 201310660912.7, Feb. 29, 2016, 14 pages.

* cited by examiner

*Primary Examiner* — Thanh-Nhan P Nguyen
(74) *Attorney, Agent, or Firm* — Fenwick & West LLP

(57) ABSTRACT

A display device includes a display panel, a first pressure sensitive adhesive positioned on the display panel, a quarter wavelength (λ/4) wave plate positioned on the pressure sensitive adhesive, a linear polarizer positioned on the λ/4 wave plate, and a first base layer positioned on the linear polarizer.

7 Claims, 15 Drawing Sheets

DISPLAY DEVICE AND METHOD FOR MANUFACTURING THE SAME

This application claims priority to Korean Patent Application No. 10-2012-0151147 filed on Dec. 21, 2012, which is incorporated herein by reference for all purposes as if fully set forth herein.

BACKGROUND

1. Field of the Disclosure

Embodiments of the disclosure relate to a display device, and more particularly, to a display device including a polarizer and a method for manufacturing the same.

2. Discussion of the Related Art

Recently, significance of a display device (FPD: flat panel display) has grown in accordance with development of multimedia. Accordingly, various displays such as a liquid crystal display (LCD), a plasma display panel (PDP), a field emission display (FED), and an organic light emitting diode display have bee commercialized.

Among the displays, the organic light emitting diode display has advantages in that an element is formed even on a flexible substrate such as plastics, the organic light emitting diode display is capable of being driven at a low voltage of 10 V or less as compared to the plasma display panel or an inorganic light emitting diode display, power consumption is relatively small, and a sense of color is excellent. Further, the organic light emitting diode display may have three colors of red, green, and blue. Accordingly, the organic light emitting diode display is a target of attention as a next-generation display element displaying plentiful colors.

FIG. 1 is a cross-sectional view showing a known organic light emitting diode display. Referring to FIG. 1, the organic light emitting diode display is provided with a polarizer including a linear polarizer 30 and a λ/4 wave plate 20 on a display panel 10 to prevent reflection of external light. Accordingly, when external light is incident on the polarizer, external light is horizontally linearly polarized by the linear polarizer 30, and left-circularly polarized at the quarter wavelength (λ/4) wave plate 20. In addition, external light reaching the display panel is reflected back, and vertically linearly polarized at the λ/4 wave plate 20. Therefore, a polarization axis is not transmitted through another linear polarizer 30 but is absorbed. Accordingly, even though external light is incident on the display panel 10, reflected light caused by reflection is prevented from reaching a user.

The polarizer provided in the organic light emitting diode display includes many constitutions such as a pressure sensitive adhesive and a base film in addition to the λ/4 wave plate 20 and the linear polarizer 30. However, the thicknesses of the base film and the λ/4 wave plate 20 are each 40 μm or more, and the thickness of the pressure sensitive adhesive is 20 μm or more. Thus, the total thickness of the polarizer exceeds 200 μm. Accordingly, there are problems in that the thickness of the polarizer is increased, costs are increased due to use of many constitutions such as the pressure sensitive adhesive, and 3D upper and lower viewing angles are reduced when a 3D image is embodied.

SUMMARY

A display device includes a display panel, a first pressure sensitive adhesive positioned on the display panel, a quarter wavelength (λ/4) wave plate positioned on the pressure sensitive adhesive, a linear polarizer positioned on the λ/4 wave plate, and a first base layer positioned on the linear polarizer.

A method for manufacturing a display device includes forming a λ/4 wave plate on a support film, forming a linear polarizer on a first base layer, laminating the λ/4 wave plate and the linear polarizer, stripping the support film from the λ/4 wave plate, and attaching a first pressure sensitive adhesive to a lower portion of the λ/4 wave plate to allow the λ/4 wave plate to adhere onto a display panel.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings.

DETAILED DESCRIPTION

Reference will now be made in detail to embodiments of the invention, examples of which are illustrated in the accompanying drawings. Wherever possible, the same reference numbers will be used throughout the drawings to refer to the same or like parts. It will be paid attention that detailed description of known arts will be omitted if it is determined that the arts can mislead the embodiments of the invention.

Figure 1:
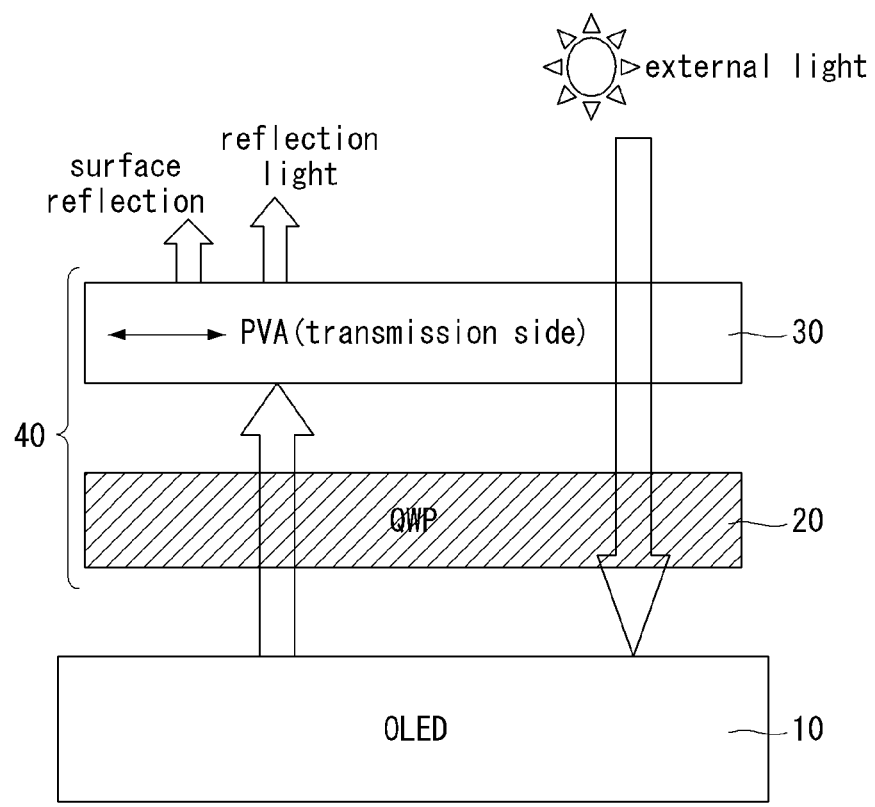
FIG. 1 is a cross-sectional view showing a known organic light emitting diode display.
Figure 2:
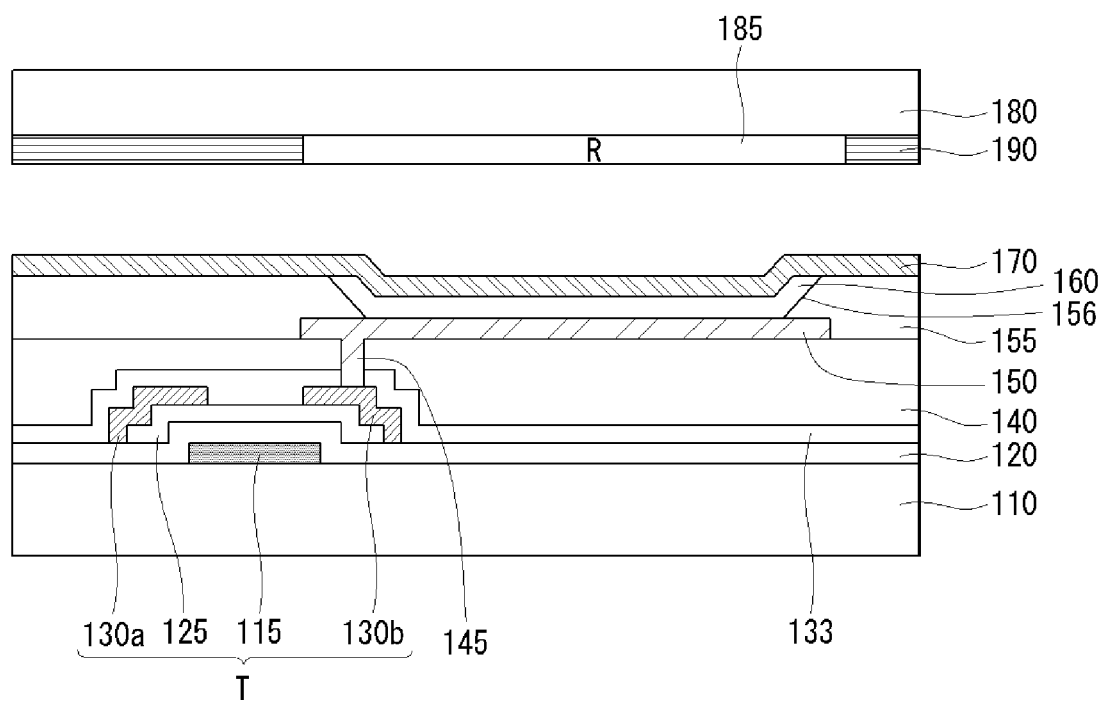
FIG. 2 is a cross-sectional view showing a display device according to an exemplary embodiment of the invention.
Figure 3:
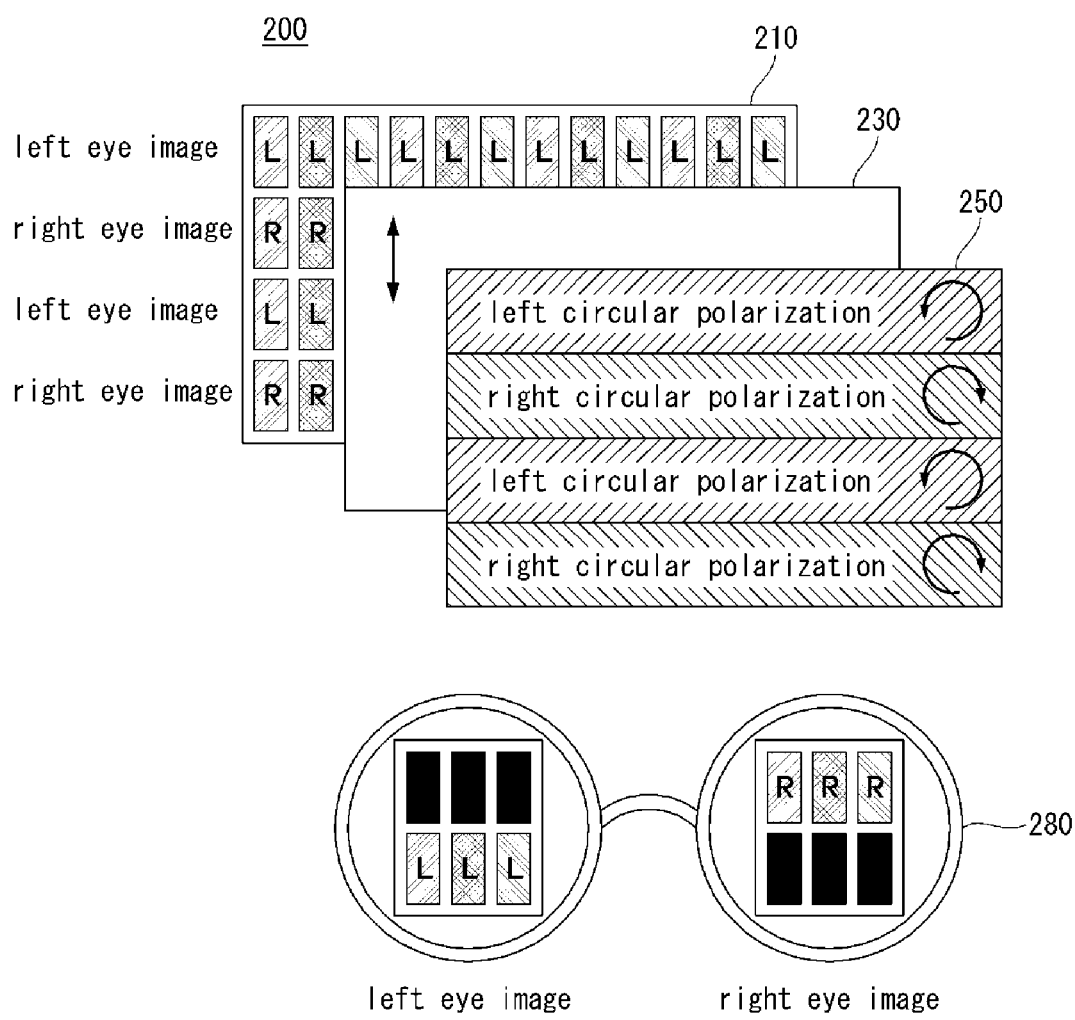
FIG. 3 is a mimetic diagram of a stereoscopic image display device according to the exemplary embodiment.

FIG. 2 is a cross-sectional view showing a display device according to an exemplary embodiment of the invention. FIG. 3 is a mimetic diagram of a stereoscopic image display device according to the exemplary embodiment. In the following, an organic light emitting diode display will be described as an example of the display device of the invention. However, the invention is not limited thereto, but is capable of being applied to all panel type display devices such as a liquid crystal display, a field emission display, and a plasma display panel.

Referring to FIG. 2, in an organic light emitting diode display according to an exemplary embodiment of the invention, a gate electrode 115 is positioned on a lower substrate 110, and a gate insulating film 120 insulating the gate electrode 115 is positioned on the gate electrode 115. A semiconductor layer 125 is positioned on the gate insulating film 120 corresponding to the gate electrode 115. A source electrode 130a and a drain electrode 130b electrically connected to the semiconductor layer 125 are positioned on the semiconductor layer 125.

In addition, a passivation layer 133 is positioned on a thin film transistor T including the gate electrode 115, the semiconductor layer 125, the source electrode 130a, and the drain electrode 130b. An overcoat layer 140 is positioned on the passivation layer 133. The overcoat layer 140 may be a planarization film reducing a step of a lower structure and protecting the lower structure. A via hole 145 through which a portion of the source electrode 130a or the drain electrode 130b is exposed is positioned in the overcoat layer 140. A pixel electrode 150 electrically connected to the source electrode 130a or the drain electrode 130b is positioned on the overcoat layer 140.

A bank layer 155 including an opening 156 through which the pixel electrode 150 is exposed is positioned on the pixel electrode 150. The bank layer 155 may be a pixel definition film reducing the step of the lower structure and defining a light emitting region. A light emitting layer 160 is positioned on the pixel electrode 150. The light emitting layer 160 is formed of an organic material emitting white light to emit white light, or emits white light through red, green, and blue light emitting layers. Accordingly, white light emitted from the light emitting layer 160 may pass through a color filter as will be described below to embody red, green, and blue colors. A counter electrode 170 is positioned on the lower substrate 110 including the light emitting layer 160. The counter electrode 170 may be formed of metal having a low work function, such as aluminum (Al), silver (Ag), magnesium (Mg), calcium (Ca), or an alloy thereof.

In addition, an upper substrate 180 is positioned on the lower substrate 110. The upper substrate 180 seals the lower substrate 110, and is provided with a color filter 185 and a black matrix 190. The color filter 185 is red, green, and blue color filters, and converts white light emitted from the light emitting layer 160 into red, green, and blue lights to embody a full color.

Meanwhile, the display device of the invention may be the stereoscopic image display device embodying a stereoscopic image.

Referring to FIG. 3, a stereoscopic image display device 200 according to an exemplary embodiment of the invention is provided with a display panel 210, a polarizer 230, a patterned retarder 250, and polarizing eyeglasses 280. The display panel 210 may be embodied as a display panel by other flat panel displays such as a field emission display, a plasma display panel, and a liquid crystal display (LCD) panel in addition to the organic light emitting display panel.

In the display panel 210, a left eye image L and a right eye image R are alternately displayed in a line by line form. The polarizer 230 is an analyzer attached onto an upper substrate of the display panel 210, and allows only predetermined linearly polarized light of light that is transmitted through the display panel 210 and incident to be transmitted therethrough.

The patterned retarder 250 is provided with first retarder patterns and second retarder patterns alternately disposed in the line by line form. It is preferable that the retarder patterns be disposed in the line by line form to form an angle of +45° and −45° to an absorption axis of the polarizer 230. Each of the retarder patterns delays a phase of light by a quarter wavelength ($\lambda$ (wavelength)/4) by using a birefringence medium. An optical axis of the first retarder pattern and an optical axis of the second retarder pattern are orthogonal to each other. Accordingly, the first retarder pattern is disposed to face a line in which the left eye image is displayed in the display panel 210, thus converting light of the left eye image into first polarized light (circularly polarized light or linearly polarized light). Accordingly, the second retarder pattern is disposed to face a line in which the right eye image is displayed in the display panel 210, thus converting light of the right eye image into second polarized light (circularly polarized light or linearly polarized light). For example, the first retarder pattern may be embodied as a polarizing filter through which left-circularly polarized light is transmitted. The second retarder pattern may be embodied as a polarizing filter through which right-circularly polarized light is transmitted.

A polarization film through which only a first polarization component is transmitted adheres to a left eye of the polarizing eyeglasses 280. A polarization film through which only a second polarization component is transmitted adheres to a right eye of the polarizing eyeglasses 280. Accordingly, an observer wearing the polarizing eyeglasses 280 sees only the left eye image through the left eye and only the right eye image through the right eye to feel an image displayed on the display panel 210 as a stereoscopic image.

Meanwhile, the polarizer preventing external light from being reflected may be attached to the organic light emitting diode display or the stereoscopic image display device of the invention.

Figure 4:
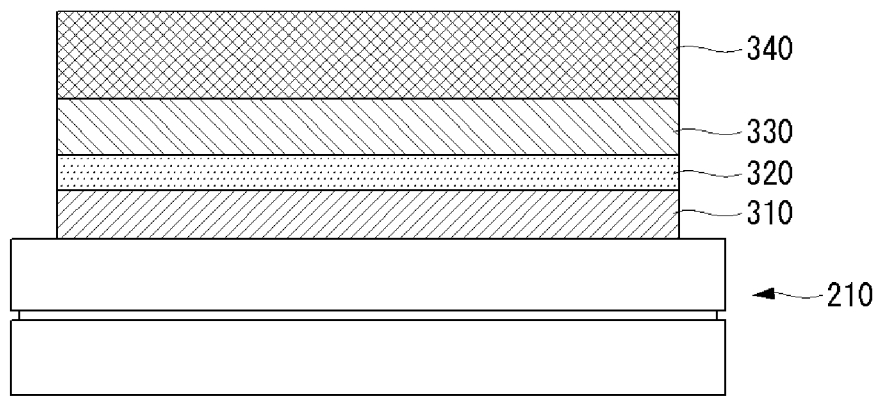
FIG. 4 is a cross-sectional view showing a display device according to a first exemplary embodiment of the invention.
Figure 5A:
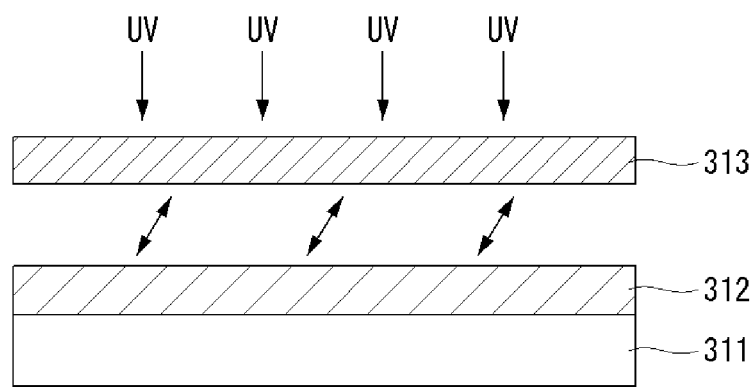
FIGS. 5a and 5b are cross-sectional views showing a method for manufacturing a λ/4 wave plate according to the first exemplary embodiment of the invention.
Figure 5B:
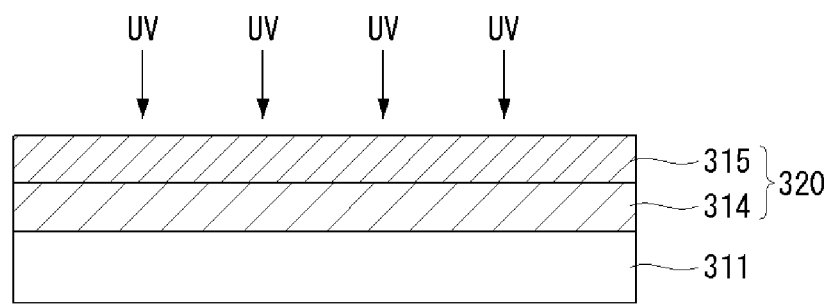

FIG. 4 is a cross-sectional view showing a display device according to a first exemplary embodiment of the invention. FIGS. 5a and 5b are cross-sectional views showing a method for manufacturing a $\lambda$/4 wave plate according to the first exemplary embodiment of the invention. FIGS. 6a to 6d are cross-sectional views showing a method for manufacturing the display device according to the first exemplary embodiment of the invention.

Referring to FIG. 4, the display device according to the first exemplary embodiment of the invention includes the display panel 210, a first pressure sensitive adhesive 310 positioned on an upper surface of the display panel 210, a $\lambda$/4 wave plate 320 positioned on the first pressure sensitive adhesive 310, a linear polarizer 330 positioned on the $\lambda$/4 wave plate 320, and a first base film 340 positioned on the linear polarizer 330.

The first pressure sensitive adhesive (PSA) 310 act to adhere films such as the $\lambda$/4 wave plate 320 to the display panel 210. An adhesive composition including an acryl-based copolymer having good elasticity and adhesion property and reducing generation of fine bubbles between the display panel 210 and the first pressure sensitive adhesive 310 to prevent stripping of the first pressure sensitive adhesive 310 may be used. The first pressure sensitive adhesive 310 may act to perform adhesion and also have predetermined elasticity to protect the films from an impact of the outside.

The λ/4 wave plate 320 causes an optical path difference having a wavelength of ¼λ between linearly polarized lights vibrating in directions that are perpendicular to each other. A detailed description of the present λ/4 wave plate will be described later.

The linear polarizer 330 absorbs any one component of white light in a non-polarized state by a conjugation structure of an aligned dichroic material or an aligned polymer chain, and allows another component that is orthogonal to one component to be transmitted therethrough. For example, an iodine-based polarization film, a dye-based polarization film, and a polyene-based polarization film may be used as the linear polarizer 330. The iodine-based polarization film is aligned by a polyvinyl alcohol (PVA) chain in which an iodine ion chain (polyiodide) is stretched and aligned to have a polarization property. The dye-based polarization film is aligned by the PVA chain in which a dichroic dye is stretched and aligned to have the polarization property. Meanwhile, the polyene-based polarization film forms polyene by a dehydration reaction of a PVA film or a dehydrochloriination reaction of a PVC film to have the polarization property.

The linear polarizer 330 is provided with the absorption axis and a polarization axis. The absorption axis is an axis in which the iodine ion chain is stretched and aligned and an axis removing a component of light when any one component of two components of light, which vibrate in a predetermined direction and are perpendicular to each other, interacts with an electron of the linear polarizer 330 to convert electric energy of light into electronic energy. The polarization axis is an axis perpendicular to the absorption axis, and allows light vibrating in a polarization axis direction to be transmitted therethrough.

The first base film 340 acts to support lower films, perform protection from an impact of the outside, and reinforce durability, moisture proof, and mechanical strength. The first base film 340 is formed of an acryl-based film or TAC (triacetylcellulose). The first base film 340 may be subjected to surface treatment such as hard coating for increasing surface hardness, antiglaring (AG) for preventing reflection of external light and a reduction in visibility resulting therefrom, antireflection (AF), or low reflection (LR).

As described above, the display device according to the first exemplary embodiment of the invention may be constituted by the display panel 210, the first pressure sensitive adhesive 310, the λ/4 wave plate 320, the linear polarizer 330, and the first base film 340 to remove reflection light formed due to reflection of external light on the display panel 210.

In the following, the λ/4 wave plate 320 of the invention and a method for manufacturing the same will be described with reference to FIGS. 5a and 5b. First, referring to FIG. 5a, in the λ/4 wave plate 320, a photoaligning agent 312 is applied on a support film 311. Subsequently, polarized ultraviolet rays (UV) are radiated by using a mask 313 having a predetermined optical axis to form a unidirectionally aligned photoalignment film 314 shown in FIG. 5B. Next, referring to FIG. 5b, a liquid crystal 315 is applied on the photoalignment film 314. In more detail, the liquid crystal 315 is dissolved in an organic solvent and applied on the photoalignment film 314. Subsequently, drying is performed at a temperature of 120° C. for 3 minutes to remove the organic solvent. In this case, the liquid crystal 315 is arranged in an alignment direction of the photoalignment film 314. In addition, the liquid crystal 315 is cured by radiating non-polarized UV on the liquid crystal 315 to form the λ/4 wave plate 320 of the invention.

A method for manufacturing the display device according to the first exemplary embodiment of the invention as described above will be described below. FIGS. 6a to 6d are views showing the method for manufacturing the display device according to the first exemplary embodiment of the invention for each process.

Figure 6A:
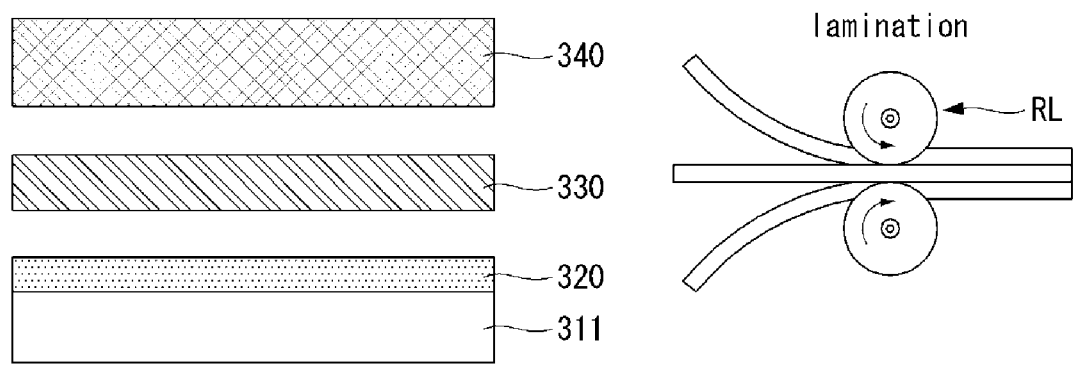
FIGS. 6a to 6d are cross-sectional views showing a method for manufacturing the display device according to the first exemplary embodiment of the invention.

Referring to FIG. 6a, the λ/4 wave plate 320 formed on the support film 311 is prepared, and the linear polarizer 330 and the first base film 340 are prepared. In addition, the λ/4 wave plate 320, the first base film 340, and the linear polarizer 330 interposed therebetween are provided between two rollers RL, are laminated to perform adhesion. Although not shown in the drawing, an adhesive may be formed on both surfaces of the linear polarizer 330 to perform lamination.

Figure 6B:
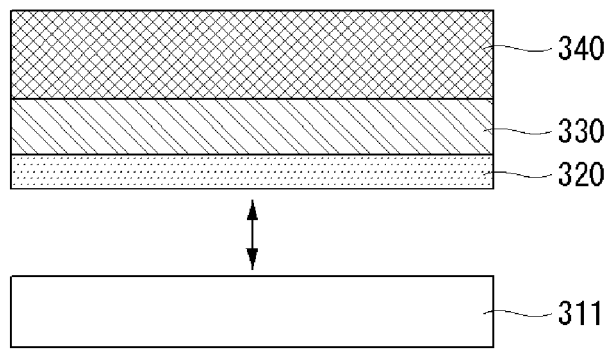

Next, referring to FIG. 6b, the support film 311 is separated from the λ/4 wave plate 320. In the invention, materials of the λ/4 wave plate 320 and the support film 311 are designed so that the λ/4 wave plate 320 and the support film 311 are well separated from each other by the following method. First, a molecular structure of the material of the λ/4 wave plate 320 and the molecular structure of the material of the support film 311 are designed to be asymmetric to each other. For example, when the λ/4 wave plate 320 is designed in a linear chain form and the support film 311 is designed in a cycle form so that the molecular structures are asymmetric to each other, adhesive strengths of the λ/4 wave plate 320 and the support film 311 are reduced. Second, the material of the λ/4 wave plate 320 and the material of the support film 311 are designed to have opposite polarities. For example, when the material of the λ/4 wave plate 320 is designed to have a polar molecule and the material of the support film 311 is designed to be non-polar, adhesive strengths of the λ/4 wave plate 320 and the support film 311 are reduced. Third, among the materials of the λ/4 wave plate 320, the material not swollen by the solvent is used. For example, when the support film 311 is TAC, a CHN-based or CPME-based solvent is used to form the λ/4 wave plate 320. When the support film 311 is acryls, a MIBK or PGME-based solvent is used to reduce the adhesive strengths of the λ/4 wave plate 320 and the support film 311. Through the aforementioned method, the adhesive strengths of the λ/4 wave plate 320 and the support film 311 may be reduced and the support film 311 may be easily separated.

Figure 6C:
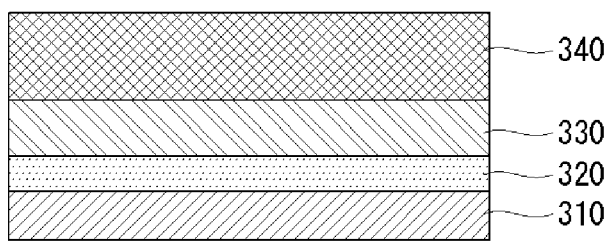
Figure 6D:
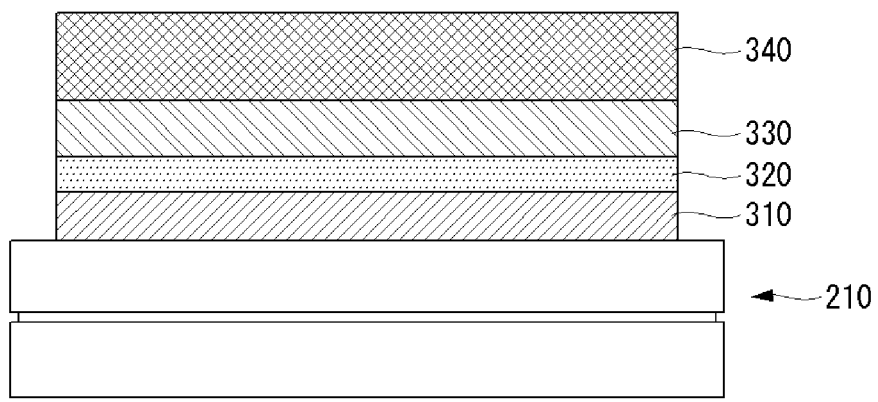

Subsequently, referring to FIG. 6c, the first pressure sensitive adhesive 310 is formed on one surface of the λ/4 wave plate 320 from which the support film 311 is separated, and attached to the display panel 210 as shown in FIG. 6d to manufacture the display device according to the first exemplary embodiment of the invention.

As described above, in the display device according to the first exemplary embodiment of the invention, the λ/4 wave plate may be formed by a coating method to reduce the thickness of the λ/4 wave plate, which has a thickness of about 50 μm in the prior art, to about 1 μm. Further, the pressure sensitive adhesive and the base film between the λ/4 wave plate and the linear polarizer may be omitted. Accordingly, there is an advantage in that the thickness of polarizer is significantly reduced.

Meanwhile, the display device of the invention may be used even in the stereoscopic image display device.

Figure 7:
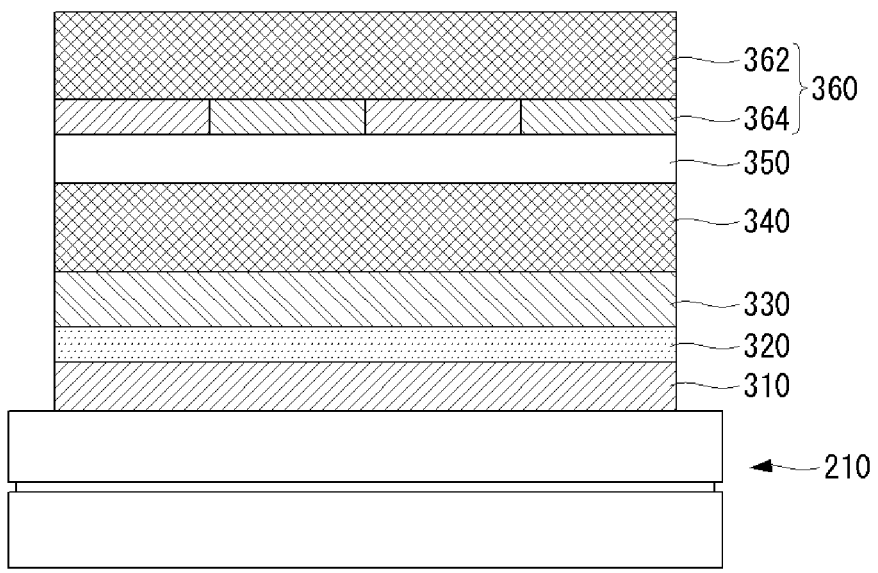
FIG. 7 is a view showing a display device according to a second exemplary embodiment of the invention.
Figure 8:
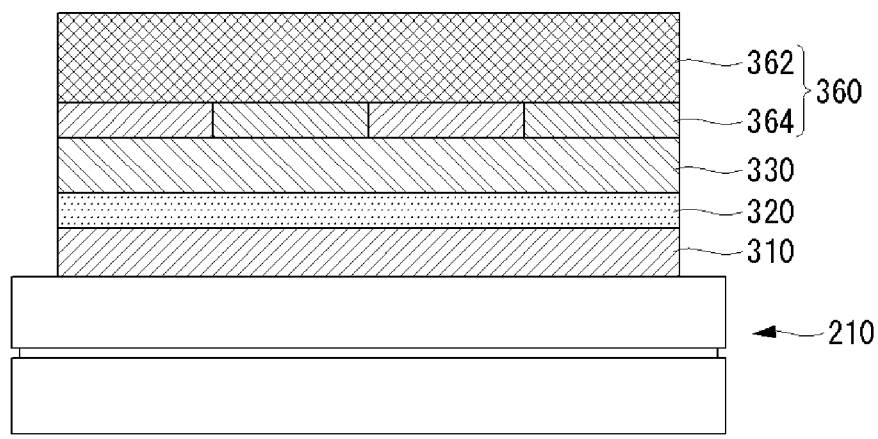
FIG. 8 is a view showing a display device according to a third exemplary embodiment of the invention.

FIG. 7 is a view showing a display device according to a second exemplary embodiment of the invention. FIG. 8 is a view showing a display device according to a third exemplary embodiment of the invention. In the following, the same reference numerals designate the same elements as the first exemplary embodiment, and a description thereof will be omitted.

Referring to FIG. 7, the display device according to the second exemplary embodiment of the invention includes a second pressure sensitive adhesive 350 positioned on the first base film 340 and a patterned retarder film 360 positioned on the second pressure sensitive adhesive 350 in addition to the display device of the first exemplary embodiment.

In more detail, the patterned retarder film 360 includes a patterned retarder layer 364 formed on a second base film 362. The second base film 362 has the same constitution as the first base film 340. As described above, the patterned retarder layer 364 is constituted by the first retarder patterns and the second retarder patterns alternately disposed in the line by line form. The retarder patterns are disposed in the line by line form so as to form an angle of +45° and −45° to the absorption axis of the polarizer. The patterned retarder film 360 adheres onto the first base film 340 through the second pressure sensitive adhesive 350 to manufacture the display device according to the second exemplary embodiment of the invention.

Meanwhile, referring to FIG. 8, the display device according to the third exemplary embodiment of the invention has a structure where the first base film 340 and the second pressure sensitive adhesive 350 are omitted from the second exemplary embodiment. In more detail, the display device according to the third exemplary embodiment of the invention includes the display panel 210, the first pressure sensitive adhesive 310 positioned on the display panel 210, the λ/4 wave plate 320 positioned on the first pressure sensitive adhesive 310, the linear polarizer 330 positioned on the λ/4 wave plate 320, and the patterned retarder film 360 positioned on the linear polarizer 330.

The display device according to the third exemplary embodiment of the invention may be manufactured by laminating the linear polarizer 330 and the λ/4 wave plate 320 together with the patterned retarder film 360 instead of the first base film in the same condition as the manufacturing method of the first exemplary embodiment. The display device according to the third exemplary embodiment of the invention has an advantage in that the thickness of the polarizer is further reduced.

Figure 9A:
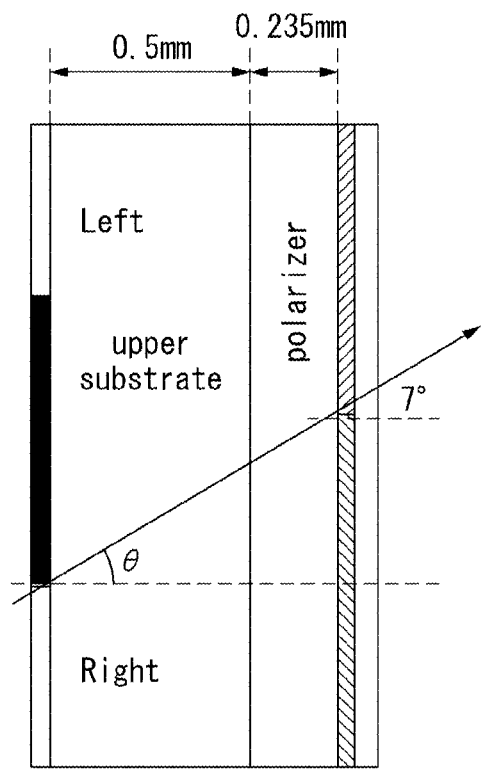
FIG. 9a is a mimetic diagram showing 3D upper and lower viewing angles of a known display device.
Figure 9B:
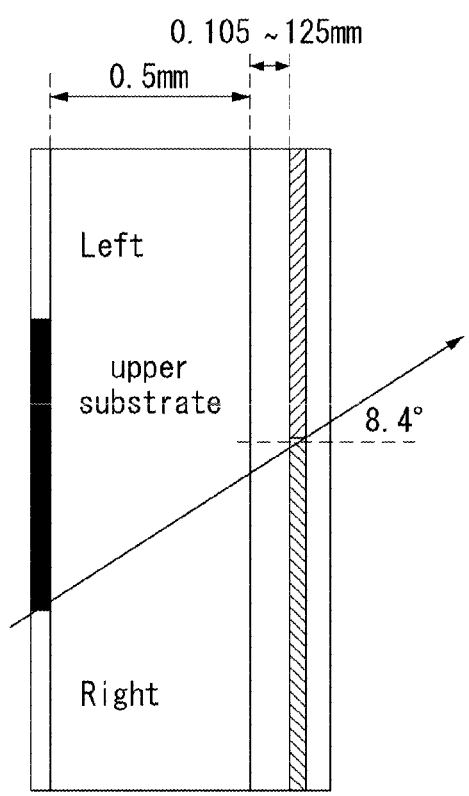
FIG. 9b is a mimetic diagram showing 3D upper and lower viewing angles of the display device according to the second exemplary embodiment of the invention.
Figure 9C:
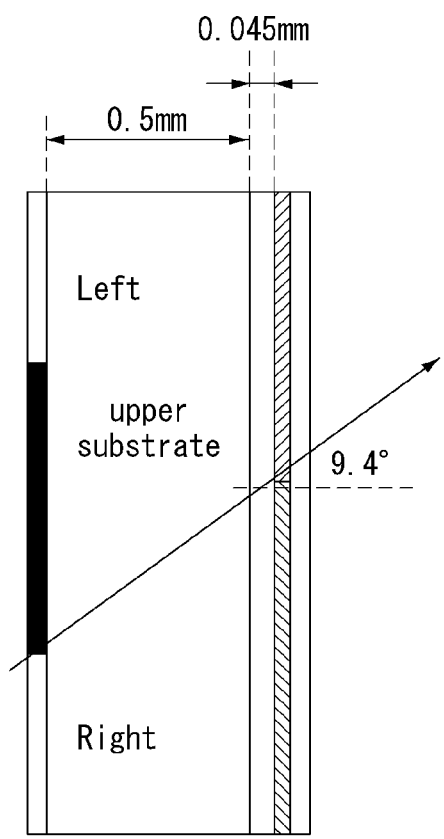
FIG. 9c is a mimetic diagram showing 3D upper and lower viewing angles of the display device according to the third exemplary embodiment of the invention.

FIG. 9a is a mimetic diagram showing 3D upper and lower viewing angles of a known display device. FIG. 9b is a mimetic diagram showing 3D upper and lower viewing angles of the display device according to the second exemplary embodiment of the invention. FIG. 9c is a mimetic diagram showing 3D upper and lower viewing angles of the display device according to the third exemplary embodiment of the invention.

Referring to FIG. 9a, in a known display device where an upper substrate has a thickness of 0.5 mm and a polarizer has a thickness of 0.235 mm, a side viewing angle is about 7° and 3D upper and lower viewing angles are about 14°. On the other hand, in the case of the second exemplary embodiment of the invention shown in FIG. 9b, the thickness of the polarizer is reduced to 0.105 to 0.125 mm. Accordingly, the side viewing angle is about 8.4° and the 3D upper and lower viewing angles are about 17°. Further, in the case of the third exemplary embodiment of the invention shown in FIG. 9c, the thickness of the polarizer is further reduced to 0.045 mm. Accordingly, it can be seen that the side viewing angle is about 9.4° and the 3D upper and lower viewing angles are about 19°.

As described above, the display devices according to the second and third exemplary embodiments of the invention have an advantage in that the thickness of the polarizer is reduced to significantly improve the 3D upper and lower viewing angles when the stereoscopic image is embodied.

Figure 10:
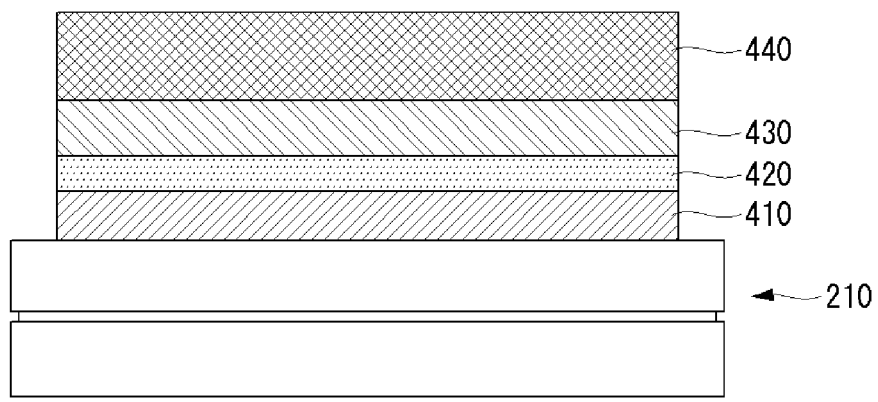
FIG. 10 is a view showing a display device according to a fourth exemplary embodiment of the invention.
Figure 11A:
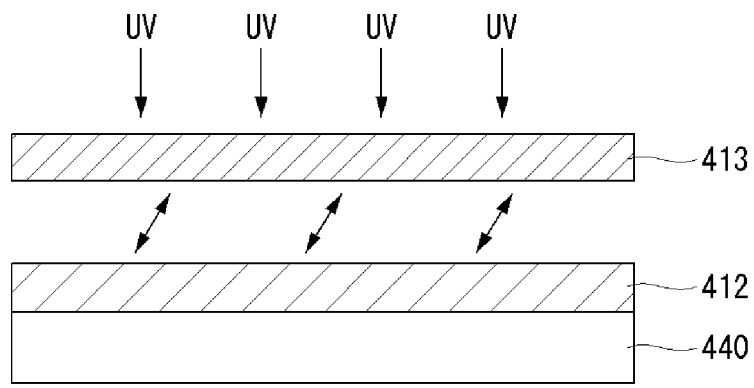
FIGS. 11a to 11c are views showing a method for manufacturing a linear polarizer according to the fourth exemplary embodiment of the invention for each process.
Figure 11B:
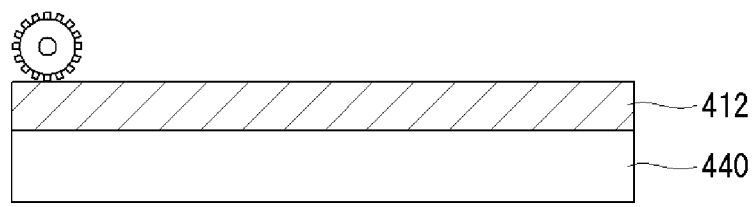
Figure 11C:
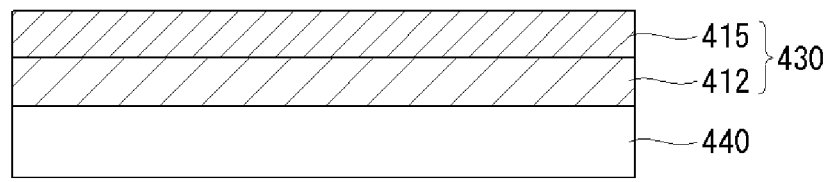

Meanwhile, unlike the first to third exemplary embodiments of the invention, a general film may be used as the λ/4 wave plate, and the linear polarizer may be formed by the coating method. FIG. 10 is a view showing a display device according to a fourth exemplary embodiment of the invention. FIGS. 11a to 11c are views showing a method for manufacturing a linear polarizer according to the fourth exemplary embodiment of the invention for each process. In the following, in order to prevent confusion with the first to third exemplary embodiments, different reference numerals designate the same elements. However, a detailed description thereof is given in the above and thus will be omitted.

Referring to FIG. 10, the display device according to the fourth exemplary embodiment of the invention includes the display panel 210, a first pressure sensitive adhesive 410 positioned on the upper surface of the display panel 210, a λ/4 wave plate 420 positioned on the first pressure sensitive adhesive 410, a linear polarizer 430 positioned on the λ/4 wave plate 420, and a base film 440 positioned on the linear polarizer 430. A general film type wave plate is used as the λ/4 wave plate 420. The linear polarizer 430 is formed by performing coating by the same coating method as the first exemplary embodiment.

In more detail, referring to FIG. 11a, a photoaligning agent is applied on the base film 440. Subsequently, polarized ultraviolet rays (UV) are radiated by using a mask 413 having a predetermined optical axis to form a unidirectionally aligned alignment film 412. Referring to FIG. 11b as another method, a polyimide aligning agent is applied on the base film 440, and rubbed to form the unidirectionally aligned alignment film 412. Subsequently, referring to FIG. 11c, a liquid crystal 415 is applied on the alignment film 412 and cured to be arranged in an alignment direction of the alignment film 412, thus manufacturing the linear polarizer 430.

The linear polarizer 430 formed on the base film 440 is laminated and integrated with the λ/4 wave plate 420, and then attached to the display panel 210 as shown in FIG. 10 by using the pressure sensitive adhesive 410 to manufacture the display device.

As described above, in the display device according to the fourth exemplary embodiment of the invention, the linear polarizer may be formed by the coating method to reduce the thickness of the λ/4 wave plate, which has a thickness of about 25 μm in the prior art, to about 3 μm. Further, the pressure sensitive adhesive and the base film between the λ/4 wave plate and the linear polarizer may be omitted. Accordingly, there is an advantage in that the thickness of polarizer is significantly reduced.

Meanwhile, the display device according to the fourth exemplary embodiment of the invention may be used even in the stereoscopic image display device.

Figure 12:
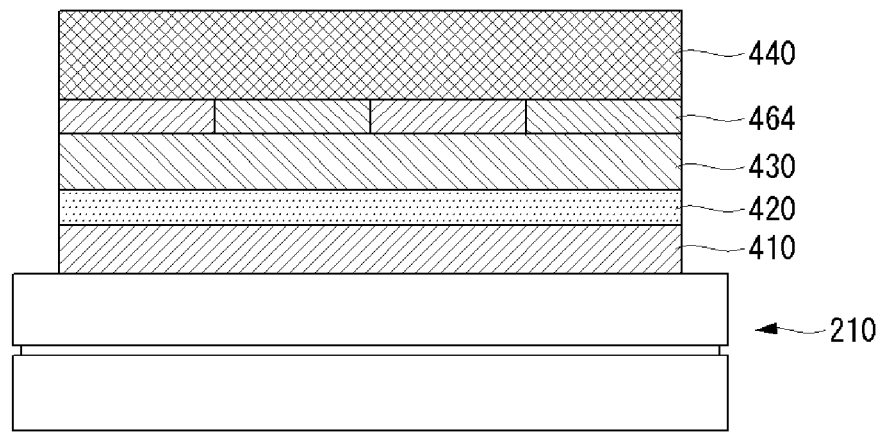
FIG. 12 is a view showing a display device according to a fifth exemplary embodiment of the invention.

FIG. 12 is a view showing a display device according to a fifth exemplary embodiment of the invention. In the following, the same reference numerals designate the same elements as the fourth exemplary embodiment, and a description thereof will be omitted.

Referring to FIG. 12, the display device according to the fifth exemplary embodiment of the invention further includes a patterned retarder layer 464 in addition to the fourth exemplary embodiment. In more detail, the patterned retarder layer 464 is formed on the base film 440. The linear polarizer 430 is formed on the patterned retarder layer 464 by the coating method. In addition, the base film 440 on which the linear polarizer 430 is applied is laminated and integrated with the λ/4 wave plate 420, and then attached to the display panel 210 through the pressure sensitive adhesive 410 to manufacture the display device according to the fifth exemplary embodiment of the invention.

The display device according to the fifth exemplary embodiment of the invention may further include the patterned retarder layer in addition to the fourth exemplary embodiment, and thus there is an advantage in that the thickness of the polarizer is further reduced.

Figure 13A:
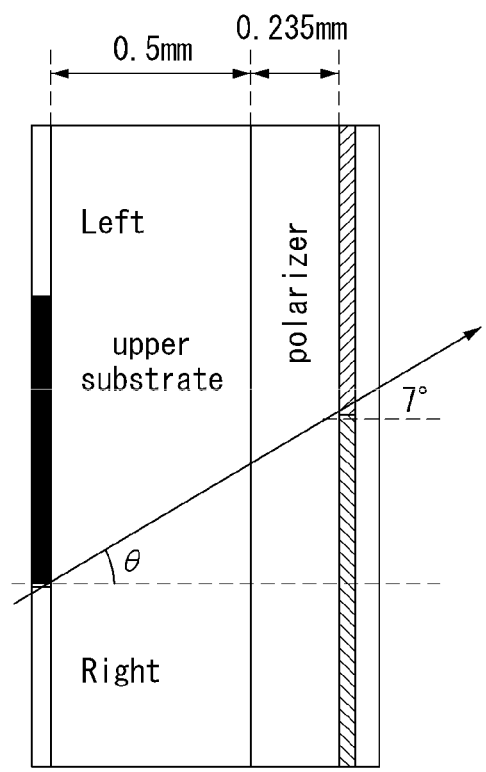
FIG. 13a is a mimetic diagram showing the 3D upper and lower viewing angles of the known display device.
Figure 13B:
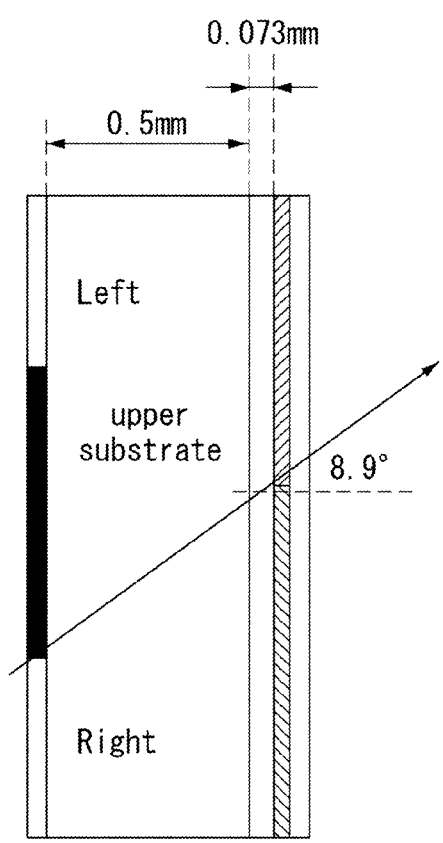
FIG. 13b is a mimetic diagram showing 3D upper and lower viewing angles of the display device according to the fifth exemplary embodiment of the invention.

FIG. 13a is a mimetic diagram showing the 3D upper and lower viewing angles of the known display device. FIG. 13b is a mimetic diagram showing 3D upper and lower viewing angles of the display device according to the fifth exemplary embodiment of the invention.

Referring to FIG. 13a, in the known display device where an upper substrate has a thickness of 0.5 mm and a polarizer has a thickness of 0.235 mm, a side viewing angle is about 7° and 3D upper and lower viewing angles are about 14°. On the other hand, in the case of the fifth exemplary embodiment of the invention shown in FIG. 13b, the thickness of the polarizer is reduced to 0.073 mm. Accordingly, the side viewing angle is about 8.9° and the 3D upper and lower viewing angles are about 18°. As described above, the display device according to the fifth exemplary embodiment of the invention has an advantage in that the thickness of the polarizer is reduced to significantly improve the 3D upper and lower viewing angles when the stereoscopic image is embodied.

Meanwhile, when the display panel of the invention is the liquid crystal display panel, the polarizer of the stereoscopic image display device may be constituted by one linear polarizer and the patterned retarder layer.

Figure 14:
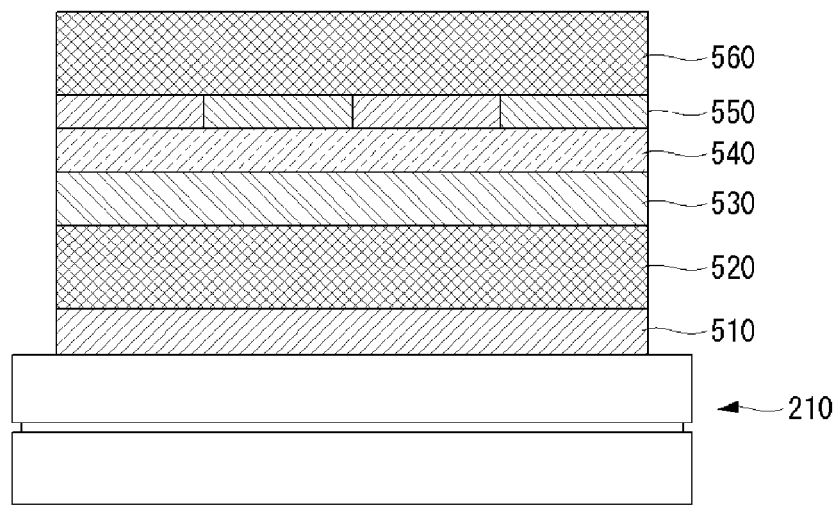
FIG. 14 is a cross-sectional view showing a display device according to a sixth exemplary embodiment of the invention.
Figure 15:
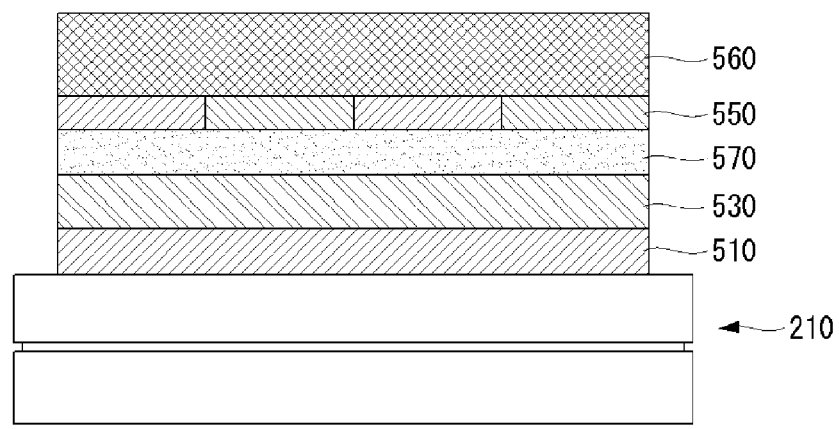
FIG. 15 is a cross-sectional view showing a display device according to a seventh exemplary embodiment of the invention.
Figure 16:
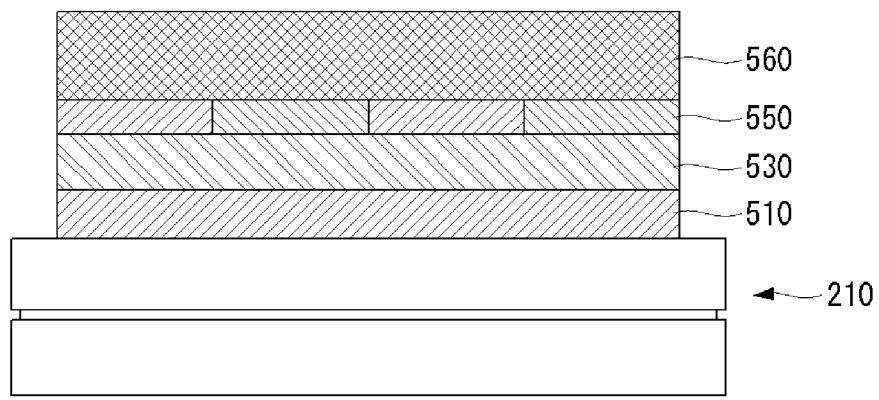
FIG. 16 is a cross-sectional view showing a display device according to an eighth exemplary embodiment of the invention.

FIG. 14 is a cross-sectional view showing a display device according to a sixth exemplary embodiment of the invention. FIG. 15 is a cross-sectional view showing a display device according to a seventh exemplary embodiment of the invention. FIG. 16 is a cross-sectional view showing a display device according to an eighth exemplary embodiment of the invention.

Referring to FIG. 14, the display device includes a pressure sensitive adhesive 510 positioned on the display panel 210, a first base film 520 positioned on the pressure sensitive adhesive 510, a linear polarizer 530 positioned on the first base film 520, a UV adhesive 540 positioned on the linear polarizer 530, a patterned retarder layer 550 positioned on the UV adhesive 540, and a second base film 560 positioned on the patterned retarder layer 550.

In the sixth exemplary embodiment of the invention, the linear polarizer 530 is formed by the coating method like the fourth exemplary embodiment. In more detail, the linear polarizer 530 is formed on the first base film 520 by the coating method. In addition, after an alignment film is formed on the second base film 560 and reactive liquid crystal (reactive mesogen) is applied, different polarized UVs are radiated to form the patterned retarder layer 550 having different polarizations. Subsequently, the first base film 520 and the second base film 560 adhere to each other through the UV adhesive 540 to be integrated, and attached to the display panel 210 by the adhesive 510.

Particularly, in the invention, the first base film 520 and the second base film 560 are formed of a hydrophobic acryl-based material. Further, the UV adhesive 540 not generating water during a curing process is used to improve a water-proofing property of the polarizer.

Meanwhile, referring to FIG. 15, in the seventh exemplary embodiment of the invention, a primer layer 570 may be formed on the patterned retarder layer 550, and the linear polarizer 530 may be formed on the primer layer 570 by coating. The primer layer 570 is a layer that is subjected to primer treatment to improve adhesive strength, and improves adhesive strength between the patterned retarder layer 550 and the linear polarizer 530. Therefore, in the display device according to the seventh exemplary embodiment of the invention, the base film may be omitted to reduce the thickness.

Further, referring to FIG. 16, in the eighth exemplary embodiment of the invention, the linear polarizer 530 may be directly formed on the patterned retarder layer 550 to further reduce the thickness of the polarizer. Accordingly, a thin type polarizer in which the pressure sensitive adhesive 510, the linear polarizer 530, the patterned retarder layer 550, and the second base film 560 are formed is formed on the display panel 210.

As described above, the display device according to the exemplary embodiments of the invention has an advantage in that the linear polarizer or the $\lambda/4$ wave plate is formed by the coating method to reduce the thickness of the polarizer. Accordingly, there are advantages in that the 3D upper and lower viewing angles of the stereoscopic image display device are improved and many layers are omitted to reduce a manufacturing cost and improve a production rate. Further, there is an advantage in that the base film of the polarizer is formed of the acryl-based material and the UV adhesive is used to improve the water-proofing property of the polarizer.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A display device comprising:
    a display panel that displays images;
    a first pressure sensitive adhesive positioned on the display panel;
    a quarter wavelength ($\lambda/4$) wave plate positioned on the first pressure sensitive adhesive;
    a linear polarizer positioned on the $\lambda/4$ wave plate; and
    a first base layer positioned on the linear polarizer, the first base layer supporting at least the linear polarizer positioned below the first base layer.

2. The display device of claim 1, further comprising:
    a patterned retarder layer positioned between the linear polarizer and the first base layer.

3. The display device of claim 1, further comprising:
    a second pressure sensitive adhesive positioned on the first base film;
    a patterned retarder layer positioned on the second pressure sensitive adhesive; and
    and second base layer positioned on the patterned retarder layer.

4. The display device of claim 3, wherein at least one of the first and second base layers is formed of hydrophobic acryl.

5. The display device of claim 1, wherein at least one of the $\lambda/4$ wave plate and the linear polarizer is formed of a thin film having a thickness of 5 μm or less.

6. The display device of claim 1, wherein at least one of the $\lambda/4$ wave plate and the linear polarizer includes a photoalignment layer and a liquid crystal layer aligned on the photoalignment layer.

7. The display device of claim 1, wherein the first pressure sensitive adhesive is positioned directly on the display panel, and wherein the λ/4 wave plate is positioned directly on the first pressure sensitive adhesive, and wherein the linear polarizer is positioned directly on the λ/4 wave plate, and wherein the first base layer is positioned directly on the linear polarizer.

* * * * *